United States Patent [19]
Hurvitz et al.

[11] Patent Number: 5,476,699
[45] Date of Patent: Dec. 19, 1995

[54] EXTRUSION INTERLOCK ASSEMBLY

[75] Inventors: Dennis Hurvitz; Mark Sutherland, both of San Diego, Calif.

[73] Assignee: Hughes Aircraft Company, Los Angeles, Calif.

[21] Appl. No.: 147,233

[22] Filed: Nov. 2, 1993

[51] Int. Cl.⁶ ........................................ B32B 3/06
[52] U.S. Cl. .................... 428/57; 52/580; 52/588.1; 52/792.11; 220/4.31; 220/4.32; 220/4.33; 403/331; 403/373; 403/374; 403/375; 428/58; 428/99
[58] Field of Search .................... 428/57, 33, 58, 428/99; 220/4.31, 4.32, 4.33; 52/588.1, 580, 805; 403/331, 373, 374, 375

[56] References Cited

U.S. PATENT DOCUMENTS

4,842,905  6/1989  Stech ........................................ 428/57

*Primary Examiner*—Nasser Ahmad
*Attorney, Agent, or Firm*—Gordon R. Lindeen, III; Wanda K. Denson-Low

[57] ABSTRACT

An extrusion interlock assembly provides for the joining of two or more extruded pieces at an interlocking joint that may be slideably mated to produce an easily assembled and disassembled assembly. On one side, the interlocking joint has a first channel mechanically connected to the first side, and a first flange adjacent to the first channel also mechanically connected to the first side. On the other side, the interlocking joint similarly has a second channel and a second flange, both mechanically connected to the second side. The second channel slidably receives the first flange, and the second flange slidably receives the first channel. A fastener laterally displaces the first flange away from the second flange, and the first channel away from the second channel, causing the first flange to frictionally engage the second channel, and the second flange to frictionally engage the first channel.

12 Claims, 5 Drawing Sheets

EXTRUSION INTERLOCK ASSEMBLY

BACKGROUND OF THE INVENTION

This invention relates to an assembly having interlocking sides. More particularly, the invention relates to an extrusion interlock assembly for joining two or more extruded pieces at an interlocking joint that may be slideably mated to produce an easily assembled and disassembled assembly.

Traditional techniques for housing and shielding electronic components typically employ sections of sheet metal or plastic formed in convenient shapes and fastened together by screws or other means. Such housings are generally known as miniboxes and are widely available to the public for non-critical needs. More expensive equipment, or equipment generating sufficient heat or radio frequency fields requires a more elaborate housing and typically utilizes a cast or extruded chassis to conduct heat away from sensitive electronic components. Covers may be secured to the chassis to provide mechanical protection and electronic radio frequency (RF) shielding. An example of such an electronic equipment housing may be found in U.S. Pat. No. 4,313,025, issued to Grube, Jr. Although each of the above examples are well suited to their application, a need exists for an inexpensive and easily constructed housing which provides mechanical and electrical integrity. U.S. Pat. No. 3,450,293, Seda, et al., offers one solution to the need. There, a box-like structure is formed from a collapsible side walls and interlocking joints. The joints may be further secured by screws or other fasteners which wedge flanges of equal inside radii and equal outside radii together to form a seal resistant to moisture. Such a structure, however, requires a relatively tight fit between interlocking joint flanges during assembly. This tight fit makes assembly difficult and leaves little room for undesirable burrs and chips to locate when the fastener is inserted into the interlocking joint.

Another solution is provided by U.S. Pat. No. 4,711,361, issued to Mischenki. There, the interlocking cover joint of an enclosure in which the inward curving edge of a first side having a first radius of inside curvature may be concentrically nested along the edge with an inward curving edge of a second side having a second radius of inside curvature unequal to the first. The first side of the housing also has a flange adjacent the inward curving edge and on the same surface as the inside curvature. This flange has a curved portion curved toward the edge and a lip portion at the end of the curved portion extending away from the edge. The second side of the housing has a lip and groove on the same surface as the inside curvature of the second side edge, the lip and groove shaped to received the lip portion of the flange. This approach leaves room for undesirable burrs and chips to locate when the fastener is inserted into the interlocking joint. However, the interlocking joint is still relatively intolerant of any misalignment from part tolerance or chips created during assembly. This is especially a problem when the first and second sides are extruded pieces, and are consequently prone to having large part tolerances.

Thus, it is apparent that improvements are needed in interlocking cover joints.

SUMMARY OF THE INVENTION

The present invention provides an assembly having interlocking sides. Specifically, the invention provides an extrusion interlock assembly for joining two or more extruded pieces (or parts) at an interlocking joint that may be slideably mated to produce an easily assembled and disassembled assembly.

The invention may be characterized as an extrusion interlock assembly, or interlocking joint, for joining adjacent first and second sides of an extrusion assembly and for enabling the adjacent sides to be slidably mated. On one side of the interlocking joint, the interlocking joint consists of a first channel that is mechanically connected to the first side, and a first flange that is adjacent to the first channel and that is mechanically connected to the first side. On the other side of the interlocking joint, the interlocking joint consists of a second channel that is mechanically connected to the second side and a second flange that is mechanically connected to the second side and that is adjacent to the second channel. The second channel slidably receives the first flange, and the second flange is slidably received by the first channel. A fastener laterally displaces the first flange away from the second flange and the first channel away from the second channel so as to cause the first flange to frictionally engage the second channel, and so as to cause the second flange to frictionally engage the first channel.

The invention may also be characterized as a method of making an interlocking joint for first and second adjacent sides of an extrusion assembly. The method includes (a) forming a first channel, or slot, that is mechanically connected to the first side, and (b) forming a first tongue adjacent to the first slot that is mechanically connected to the first side. Then, (c) forming a second slot that is mechanically connected to the second side, and (d) forming a second tongue adjacent to the second slot that is mechanically connected to the second side. The second slot is oriented to receive the first tongue, and the second tongue is oriented to be received into the first slot. Next, (e) the first tongue is moved in a first direction relative to the second slot so as to receive the first tongue into the second slot, and, at the same time, (f) the first slot is moved in the first direction relative to the second tongue so as to receive the second tongue into the first slot. Finally, (g) the first tongue is moved in a second direction away from the second tongue. The second direction is normal to the first direction, so as to frictionally engage the first tongue against the second slot, and so as to frictionally engage the first slot against the second tongue.

Additionally, the invention may be characterized as a method for slidably mating interlocking adjacent sides of an extrusion assembly. This method includes (a) sliding a first integral flange that includes a first exterior engaging surface and a first fastening surface into a second channel that includes a first interior engaging surface and a second fastening surface, and simultaneously (b) sliding a second integral flange that includes a second exterior engaging surface and the second fastening surface into a first channel that includes a first interior engaging surface and the first fastening surface. Finally, this method includes (c) interposing a fastener between the first fastening surface and a longitudinal groove that projects into the second fastening surface so as to mechanically engage the first exterior engaging surface against the first interior engaging surface, and so as to mechanically engage the first interior engaging surface against the second exterior engaging surface.

The invention may also be characterized as apparatus for electrically coupling first and second parts of a housing assembly to first and second respective sides of a circuit board. A first longitudinal structure is located on the first part adjacent to a first conductive portion of the first side of the circuit board, and a second longitudinal structure is located on the second part adjacent to a second conductive portion of the second side of the circuit board. The second conductive portion is opposite the first conductive portion, and compressing means are used to compress the second longitudinal structure toward the first longitudinal structure, with the circuit board interposed therebetween, so as to bring the first and second longitudinal structures into electrical and mechanical contact with the first and second conductive portions.

It is a feature of the invention to provide an extrusion interlock assembly that may be easily and slidably assembled.

It is another feature of the invention to provide an extrusion interlock assembly that is tolerant of any misalignment or dimensional variances that may occur between the parts.

It is a further feature of the invention to utilize gaps created between the channels and flanges of the invention when the fastener is interposed into the invention to hold any chips or burrs generated during the sliding together of the assembly, or the interposition of the fastener.

It is an additional feature of the invention to provide excellent electrical tolerances between the mating parts of the extrusion interlock assembly.

It is an added feature of the invention to electrically and mechanically couple adjacent sides of the housing assembly to respective opposite sides of a circuit board.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
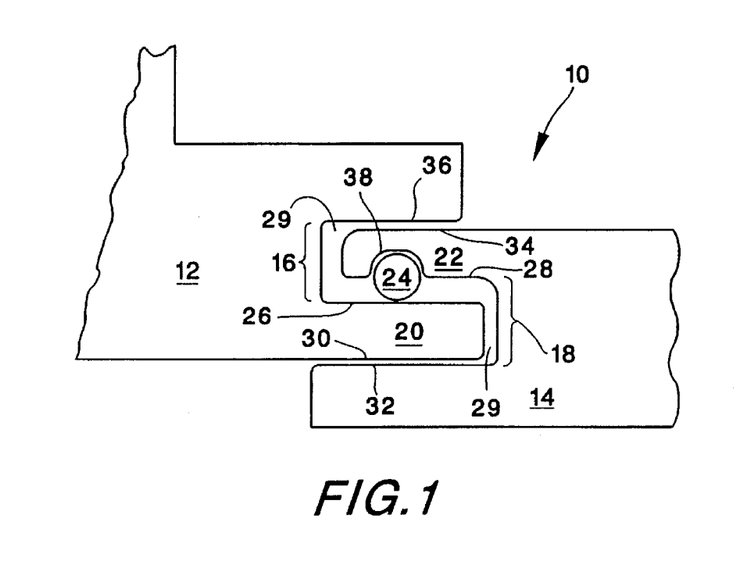
FIG. 1 is a cross-sectional view of an extrusion interlock assembly made in accordance with the present invention.

Referring first to FIG. 1, a cross-sectional view is shown of an extrusion interlock assembly 10 made in accordance with the present invention. Two interlocking pieces (or parts) 12, 14 are shown that embody the extrusion interlock assembly 10 of the present invention. The interlocking parts 12, 14 have a substantially uniform cross section throughout the depth of interlocking portions of the pieces. The pieces may include non-interlocking portions where the pieces may merely abut one another, or where they can be separate from one another. Preferably however, the pieces interlock throughout their depth, and therefore are preferably of uniform cross section throughout their depth.

The first piece 12, shown to the left in FIG. 1, and the second piece 14, shown to the right, each include substantially the same features. Each includes a channel (or slot) 16, 18, and a tongue (or flange) 20, 22. The tongue 20 of the first piece 12 is oriented to be received into the channel 14 of the second piece 14, and vice versa. In a first approach, the receiving is done by displacing the first piece 12 toward the second piece 14 by moving the first piece 12 to the right as oriented in FIG. 1, so as to slidably mate the tongues 20, 22 and channels 16, 18. In a second approach, the receiving is done by aligning a proximal end of the tongue 20 and channel 16 of the first piece 12 (first tongue 20 and first channel 16) with a distal end of the tongue 22 and channel 18 of the second piece 14 (second tongue 22 and second channel 18) and then by sliding the first tongue and channel 20, 16, relative to the second tongue and channel 22, 18, along the depth of the second tongue and channel 22, 18 in an outward direction normal to the plane of the paper, i.e., in an outward direction that is parallel to the depth of the pieces 12, 14. Finally, a combination of the first and second approaches can be used. The particular approach selected will depend on the particular application in which the present extrusion interlock assembly is utilized.

After the first tongue 20 is received into the second channel 18 and the second tongue 22 is received into the first channel 16, the first tongue 20 is displaced, relative to the second tongue 22, in a direction normal to the directions used in the first and second approaches, i.e., in a downward direction as oriented in FIG. 1. This displacement can be achieved by interposing a fastener 24 between a first exterior fastening surface 26 of the first tongue 20 and a second interior fastening surface 28 of the second channel 18, and/or by interposing the fastener 24 between a second exterior fastening surface 28 of the second tongue 22 and a first interior fastening surface 26 of the first channel 16.

Advantageously, in the embodiment of FIG. 1, such interposition can be achieved between both the first tongue 20 and second channel 18, and second tongue 22 and first channel 16 by using a single fastener 24. This is because in the embodiment of FIG. 1, the first exterior fastening surface 26 of the first tongue 20 and the first interior fastening surface 26 of the first channel 16 are the same surface, i.e., the first tongue 20 and the first channel 16 share a first common surface 26, that may thus be referred to as a first fastening surface 26. Similarly, the second exterior fastening surface 28 and the second interior fastening surface 28 are the same surface, i.e., a second common surface 28, or a second fastening surface 28. It is to be understood, however, that this need not be the case. The first tongue and channel 20, 16, and the second tongue and channel 22, 18 may each have separate surfaces from the other.

As the fastener 24 is interposed between the tongue(s) 20, 22 and channel(s) 16, 18, a gap 29 is opened between the first fastening surface 26 and the second fastening surface 28. The gap 29 holds any chips or burrs that may be produced during the displacement of the tongues 20, 22 and channels 16, 18, or the interposition of the fastener 24.

Also as the fastener is interposed between the tongue(s)

20, 22 and channel(s) 16, 18, a first exterior engaging surface 30 of the first tongue 20 frictionally engages a first interior engaging surface 32 of the second channel 18. The first exterior engaging surface 30 and the first interior engaging surface 32 are substantially planar and lie in parallel planes to each other when frictionally engaged such that when they are frictionally engaged, they are engaged along a first plane of engagement. Similarly, a second exterior engaging surface 34 of the second tongue 22 frictionally engages a first interior engaging surface 36 of the first channel 16. The second exterior engaging surface 34 and the first interior engaging surface 36 are also substantially planar and lie in parallel planes to each other when frictionally engaged such that when they are frictionally engaged, they are engaged along a second plane of engagement. The second plane of engagement need not be but generally is, parallel to the first plane of engagement. As the tongues 20, 22 and channels 16, 18 engage each other, the tongues 20, 22 and channels 16, 18 make electrical contact with each other. Thus, these two engagements along the first and second planes of engagement provide first and second points (or planes) of electrical contact between the first and second pieces.

The fastener 24 can be a screw, a nail, a nylon fastener or any other type of fastener or wedge device that will provide permanent displacement of the first tongue and channel relative to the second tongue and channel as described above. Preferably, the fastener 24 is made of an electrically conductive material, and thus preferably provides a third point of electrical contact between the first interior engaging surface 26 and the first interior engaging surface 28—a total of three points of electrical contact in the extrusion interlock assembly 10.

One variation of the invention lacks the first channel 16 and the second tongue 22. Thus, only a single tongue 20 and channel 18 are utilized. The single tongue 20 is received into the single channel 18 using either of the above-described approaches or the combination thereof, and the fastener 24 is interposed between either of the proximal or distal exterior surfaces 26, 30 of the tongue 20, and the corresponding distal or proximal interior surface 28, 32 of the channel 18 so as to displace the single tongue 20 relative to the single channel 18 in the direction normal to the directions used in the first and second approaches as described above. By eliminating the first channel 16 and the second tongue 22, however, the second point (or plane) of electrical contact is eliminated, and therefore only two points of electrical contact are achieved.

Referring again to the embodiment of FIG. 1, a cross section of a longitudinal groove 38 is shown in the second exterior fastening surface 28 of the second tongue 22 (also the distal interior 28 surface of the second channel 18). As can be seen, the fastener 24 is interposed against the groove 38 when it is interposed between the second fastening surface 28 of the second channel 18 and the first fastening surface 26 of the first channel 20. The groove 38 serves to align the fastener 24 between the surfaces 26, 28, and facilitates the tapping of a self tapping screw, if such a screw is used as the fastener 24. Note however that there is not an additional groove in the first exterior fastening surface 28. Because there is no additional groove, which would have to align with the groove 38, the invention allows for large tolerances in the amount of overlap between the first and second exterior fastening surfaces 26, 28. Thus, when such large tolerances are introduced, as a result, e.g., of an extrusion process, the invention still is able to provide an advantageous interlock between the first and second pieces, as has not heretofore been possible.

In this way, the first and second extruded pieces 12, 14 are interlocked with one another so as to provide mechanical and electrical connection therebetween.

Figure 2A:
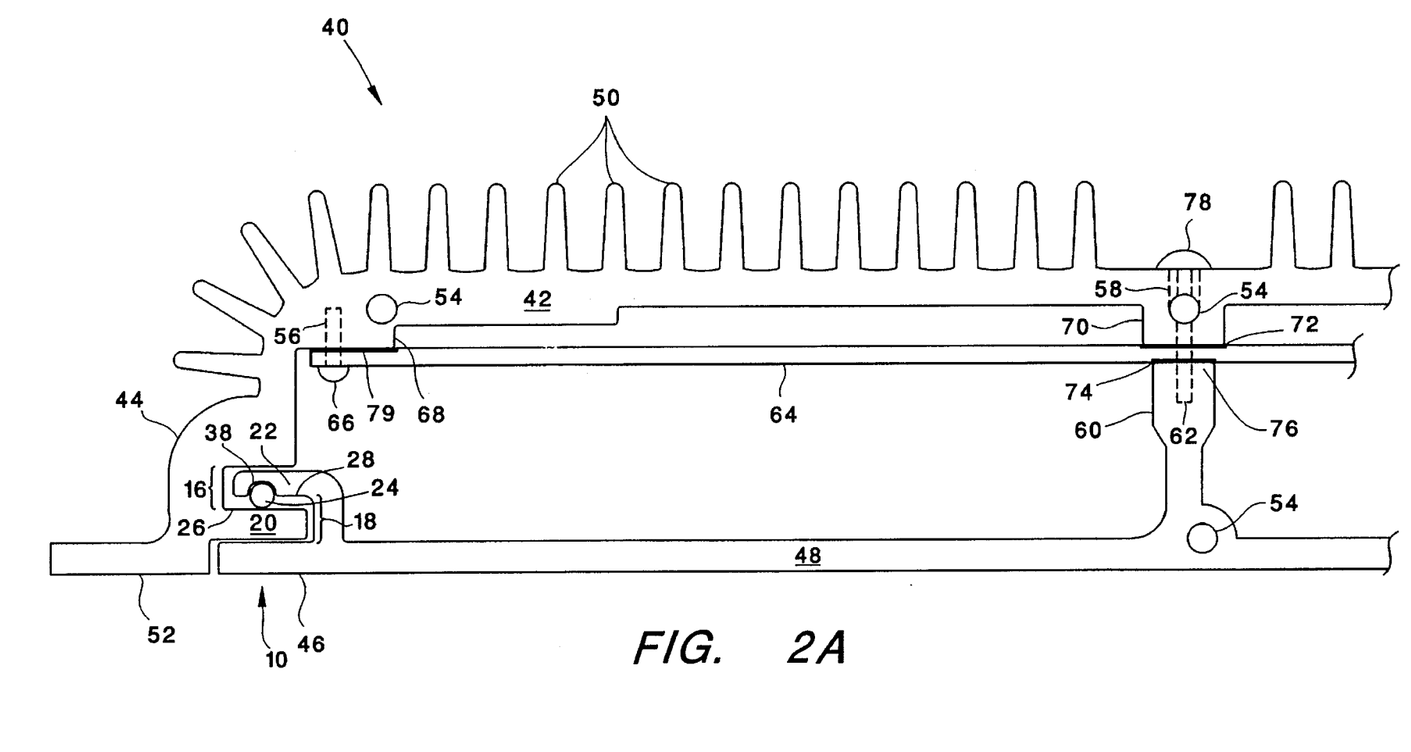
FIG. 2A is a partial cross-sectional view of a housing assembly that utilizes the extrusion interlock assembly of FIG. 1.

Referring next to FIG. 2A, a partial cross-sectional view of a housing assembly 40 is shown that utilizes the extrusion interlock assembly 10 of FIG. 1. A partial view of an extruded housing part 42 is shown interlocked at a first housing edge 44 with a first cover edge 46 of an extruded cover part 48 by way of a first extrusion interlock assembly 10 (as shown in FIG. 1). Generally the housing part 42 and the cover part 48 will be of equal depth so that when they are slidably mated, their proximal and distal edges align. The proximal and distal edges are generally perpendicular to the first housing edge 44 and the first cover edge 46. The housing part 42 includes heat-sinking fins 50, a first mounting flange 52 and a second mounting flange (not shown in FIG. 2A), end plate mounting holes 54, circuit board mounting holes 56, and compression screw holes 58. The cover part 48 includes a compression beam 60 that includes compression screw mounting holes 62, and end plate mounting holes 54.

The extrusion interlock assembly 10 is realized using the first tongue (or flange) 20 and first channel 16 that share the first fastening surface 26, and the second tongue (or flange) 22 and second channel 18 that share the second fastening surface 28, as is described above. The groove 38 is also utilized in the distal interior surface 28 of the second channel 18 (which in this embodiment is also the proximal exterior surface 28 of the second tongue 22 or the second common surface 28).

A second extrusion interlock assembly (not shown) is used opposite the first extrusion interlock assembly along second edges of the housing and cover parts 42, 48 in order to interlock the second housing edge with the second cover edge. The second extrusion interlock assembly has a cross section that is a mirror image of the first extrusion interlock assembly 10 except for a relative size difference of the first channel 16 and the second tongue 22, described below. The second housing edge and the second cover edge are substantially parallel edges with the first housing edge and the first cover edge although in theory they need not be parallel. Thus, the first and second extrusion interlock assemblies can be slidably mated by sliding the cover piece into the distal or proximal end of the housing piece 42, i.e., into or out of the plane of the paper of FIG. 2A.

In practice, a circuit board 64 is mounted into the housing piece 42 and mounting screws 66 are placed through the circuit board 64 into the circuit board mounting holes 56. The mounting holes 56 can be tapped holes or the screws 66 can be self tapping screws. Generally, four to six screws 66 and holes 56 are utilized. The holes are drilled into a first peripheral mounting structure 68 and a second peripheral mounting structure (not shown) within the housing piece 42. When the circuit board 64 is mounted within the housing piece 42 it rests at first and second tinned edges 79 against the first peripheral mounting structure 68 and the second peripheral mounting structure (not shown), respectively. Because the first and second edges 79 are tinned, the circuit board 64, makes not only mechanical contact, but electrical contact with the first and second peripheral mounting structures 68 at its first and second tinned edges 79. Note that the first and second tinned edges 79 are opposite one another (the second tinned edge is not shown in FIG. 2A). The tinned edges 79 are shown, for illustration purposes, as regions within the circuit board 46, however, in practice they are generally of conventional design, i.e., they are on the surface of the circuit board 46. Near (but not generally at) the center of the circuit board 64, a central mounting structure 70 of the housing piece 42, that parallels the first and second tinned edges 79 of the circuit board 64, supports the circuit board 64. The central mounting structure 70 contacts the circuits board 64 along an upper central portion 72 of the circuit board 64, and the circuit board 64 may be tinned (in a manner similar to the tinned edges 79, described above) along this upper central portion 72 so as to facilitate electrical coupling (or grounding) of the circuit board 64 with the housing piece 42. The tinned upper central portion 72 is also shown, for illustration purposes, as within the circuit board 46, but, as with the tinned edges 79, it is generally of conventional design.

Next, the cover part 48 is slid into the housing part 42, from either a distal end or a proximal end thereof, so as to slidably engage the tongues 20, 22 and channels 16, 18 of the first extrusion interlock assembly 10 and the second extrusion interlock assembly (not shown). When the cover part 48 is fully slid into the housing part 42, the fastener 24, e.g., a self tapping screw, may be used to displace the tongues 20, 22 and channels 16, 18 as described above and to thereby frictionally engage the tongues 20, 22 and channels 16, 18 as also described above. A similar fastener (not shown) is used to frictionally engage the tongues and channels of the second extrusion interlock assembly (not shown).

In practice, four fasteners are generally used—two for each extrusion interlock assembly, with one being interposed at each end thereof. The fasteners are generally not interposed between the tongues and channels throughout the depth of the tongues and channels, but instead, a fastener of, e.g., approximately ¾ inches in depth is interposed at each end of the tongues and channels. This type of fastener is generally sufficient to cause the engagement of the tongues and channels along their entire depth, depending on the depth of the tongues and channels, and therefore on the depth of the housing part and the cover part 48.

When the cover part 48 is slid into the housing part 42, the compression beam 60 is aligned against the circuit board 64 along a lower central portion 74 of the circuit board 64 adjacent to the central mounting structure 72 of the housing part 42. Either before or after sliding the housing and cover parts 42, 48 together, the compression screw holes 58 are drilled into the housing part 42 so as to align with the compression screw mounting holes 62 that are drilled into the compression beam 60 along its upper surface 76, as oriented in FIG. 2A. Compression screws 78 pass through the compression screw holes 58 and the circuit board 64, and are screwed into the compression screw mounting holes 62. The compression screw mounting holes 62 may be tapped, or the compression screws 78 may be self tapping. Like the upper central portion 72 of the circuit board 64, the lower central portion 74 of the circuit board 64 can be tinned (in a manner similar to the upper tinned central portion 72, described above) so as to facilitate electrical coupling (or grounding) with the cover piece 48. The tinned lower central portion 72 is shown, for illustration purposes, as within the circuit board 46, but, as with the tinned upper central portion 72, it is generally of conventional design. As the compression screws 78 are screwed into the compression beam 60, the compression beam 60 is pulled toward the central mounting structure 70, and the circuit board 64 is compressed therebetween at its upper and lower central portions 72, 74. Because the circuit board 64 is tinned adjacent to the central mounting structure 70 and adjacent to the compression beam 60, when the circuit board 64 is compressed between the compression beam 60 and the central mounting structure 70, it is placed into electrical contact with both the central mounting structure 70, and the compression beam 60. In this way, excellent electrical contact is achieved between the housing part 42, the cover part 48 and respective central portions of the circuit board 72, 74. Furthermore, if the compression screws 78 are made of an electrically conductive material, an additional point of electrical contact between the housing part 42 and the cover part 48 is provided.

Along with the installation of the compression screws 78, a proximal and a distal end plate (not shown), which are cut, e.g., from sheet aluminum, are installed to the proximal and distal ends of the housing assembly 40. The end plates are mounted using, e.g., self tapping screws that are screwed into the end plate mounting holes 54. The end plate mounting holes 54 align with end plate holes in the end plates. In addition, the end plate includes fastener holes that align with the groove 38 in the second flange 22 of the extrusion interlock assembly 10. In practice, the cover part 48 is much less likely to vary in tolerance than the housing part due to its relatively flat shape. Therefore, it is preferable that the groove 22 be in the second flange 22, which is associated with the cover part 48, rather than the first flange 20, which is associated with the housing part 42, so as to facilitate alignment of the fastener holes in the end plate, with the groove 38 in the second flange 22. The fasteners are interposed into the extrusion interlock assemblies through the fastener holes, and advantageously serve to hold the end plate in place.

In this way, a housing assembly utilizes the present invention to interlock the first and second edges of a housing part 42 with first and second edges of a cover part 48. In addition, the central mounting structure 70 of the housing part 42 and the compression beam 60 of the cover part 48 are utilized in conjunction with tinned upper and lower central portions 72, 74 of the circuit board 64 so as to provide excellent electrical contact between the circuit board 64, and the housing part 42 and cover part 48.

Figure 2B:
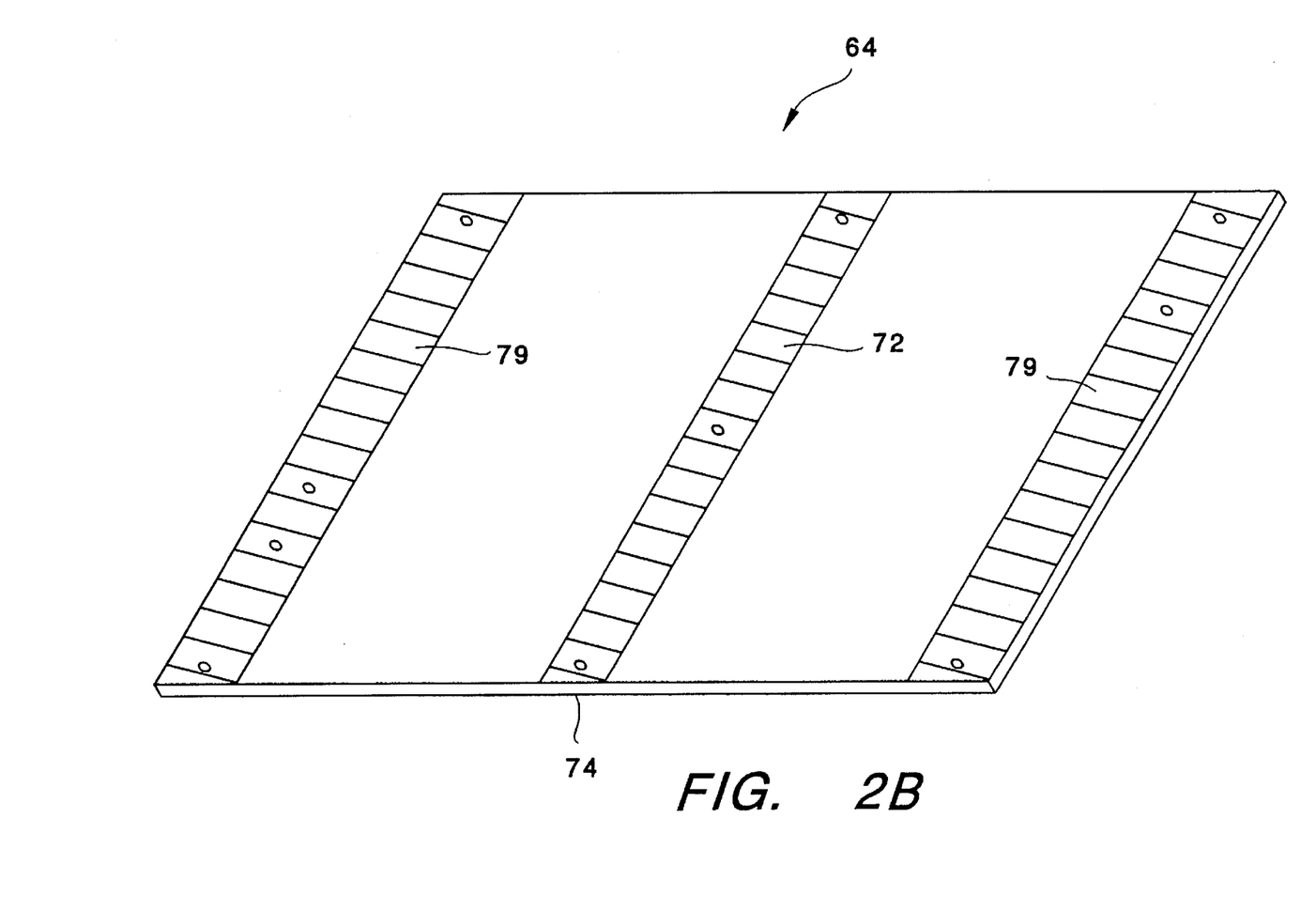
FIG. 2B is a perspective view of a circuit board than can be used with the housing assembly of FIG. 2A.

Referring next to FIG. 2B, a perspective view of the circuit board 64 is shown having the first and second tinned edges 79, and the upper and lower central portions 72, 74. The lower central portion 74 is substantially hidden from view in FIG. 2B, but is generally of approximately equal dimensions or slightly narrower than the upper central portion 72, and is immediately opposite the upper central portion 72 as shown in FIG. 2A. In practice, the first and second tinned edges 79 make electrical and mechanical contact with the peripheral mounting structures 68 when the circuit board 64 is mounted within the housing part 42 using the circuit board mounting screws 66. In addition, the circuit board makes electrical and mechanical contact along its upper central portion 72 with the central mounting structure 70 (FIG. 2A) and along its lower central portion 74 with the upper surface 76 (FIG. 2A) of the compression beam 60 (FIG. 2A). In this way, excellent electrical and mechanical connection is achieved between the cover and housing parts 48, 42 (FIG. 2A), and the circuit board 64.

Figure 3:
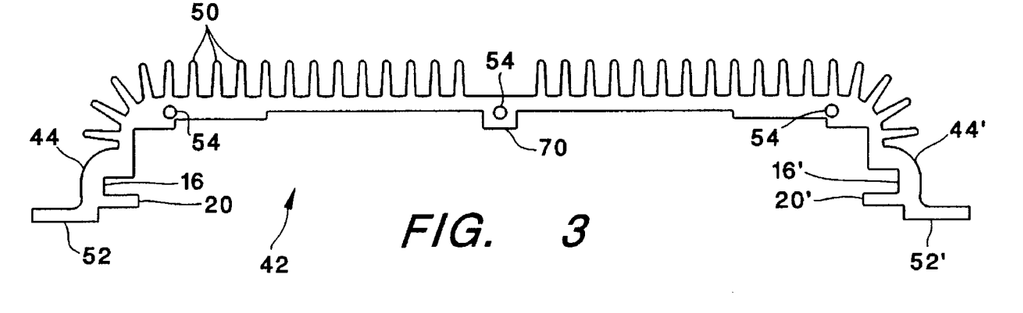
FIG. 3 is a cross-sectional view of an extruded housing part for the housing assembly of FIG. 2A.

Referring next to FIG. 3, a cross-sectional view is shown of the housing part 12 for the housing assembly of FIG. 2A. The housing part 12 is an extruded structure having generally a "U" shape (or an inverted "U" shape as oriented in FIG. 3). The housing part 12 is made using conventional extrusion technology, and is made from, e.g., aluminum. The housing part 12 includes the heat-sinking fins 50, the first and second mounting flanges 52, 52', the end plate mounting holes 54, and the central mounting structure 70. Along its first and second edges 44, 44', the housing part 42 also includes the first flange 20, 20' and the first channel 16, 16' of the first and second extrusion interlock assemblies. As can be seen, the first channel 16' of the second extrusion interlock assembly is formed slightly wider than the first channel 16 of the first extrusion interlock assembly so as to key the first and second extrusion interlock assemblies, as explained more completely below. Also of note is that the central mounting structure 70 is not perfectly centered in the housing part 42.

Figure 4:
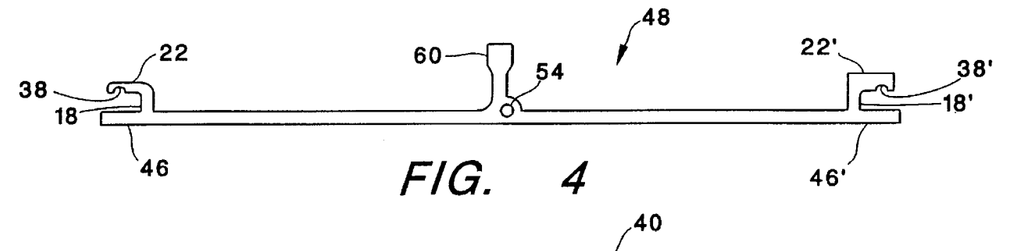
FIG. 4 is a cross-sectional view of an extruded cover part for the housing assembly of FIG. 2A.

Referring next to FIG. 4, a cross-sectional view is shown of the cover part 48 for the housing assembly of FIG. 2A. The cover part 48 is an extruded structure having generally a "T" shape. The cover part 48 is made using conventional extrusion technology, and is made from, e.g., aluminum. The cover part includes the compression beam 60 that includes the compression screw mounting holes, and one of the end plate mounting holes 54. Along its first and second edges 46, 46', the cover part 48 also includes the second flange 22, 22' and the second channel 18, 18' of the first and second extrusion interlock assemblies. The second flanges 22, 22' of the first and second extrusion interlock assemblies include the groove 38, 38' described above. Also of note is that the compression beam 60 is not perfectly centered in the housing part.

As can be seen, the second flange 22' of the second extrusion interlock assembly is formed slightly wider than the second flange 22 of the first extrusion interlock assembly so as to key the first and second extrusion interlock assemblies. As a result the first channel 16 (FIG. 3) of the first extrusion interlock assembly will not receive the second flange 22' of second extrusion interlock assembly, i.e, it is keyed to be receive only the second flange 22 of the first extrusion interlock assembly. As a result, the sliding of the cover piece 48 into housing piece 42 (FIG. 3), by slidably receiving the opposing flanges and channels of the first and second extrusion interlock assemblies, is limited to one orientation of the cover part 48 relative to the housing part 42 (FIG. 3). Advantageously, this prevents the misalignment of the compression beam 60 and the central mounting structure 70 (FIG. 3), which are not generally perfectly centered. Problematically, such misalignment could damage the circuit board 64 (FIG. 2B), or components mounted thereon that are mounted away from the lower central portion 74 (FIG. 2B) of the circuit board 64 (FIG. 2B).

Figure 5:
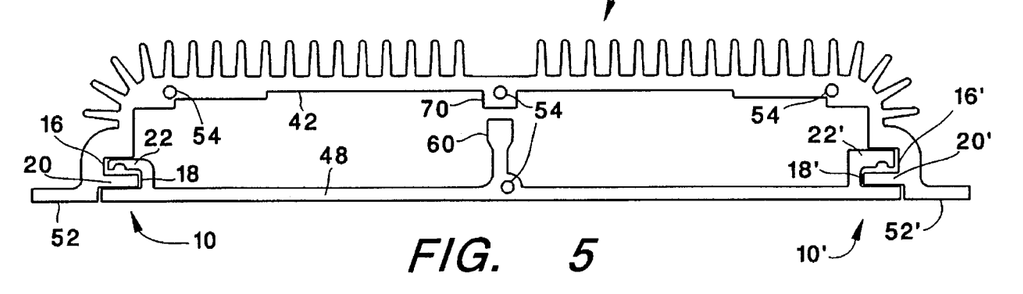
FIG. 5 is a cross sectional view of the housing assembly of FIG. 2A.

Referring to FIG. 5, a cross sectional view is shown of the housing assembly 40. The housing assembly 40 includes the housing part 42 and the cover part 48, and has generally a "B" shape (or a "B" shape rotated −90° as oriented in FIG. 5). Thus, shown are the heat-sinking fins 50, the first and second mounting flanges 52, 52', the end plate mounting holes 54, the first flanges 20, 20' and the first channels 16, 16' of the first and second extrusion interlock assemblies 10, 10', the compression beam 60 that includes the compression screw mounting holes, the central mounting structure 70, and the second flanges 22, 22' and second channels 18, 18' of the first and second extrusion interlock assemblies 10, 10'. As can be seen, the compression beam 60 is aligned adjacent to the central mounting structure 70, which is slightly off-center between the first and second edges of the housing and cover parts. Also note that the compression beam 60 divides the area within the housing assembly 40 into first and second subareas. Thus, e.g., electrical components that tend to generate radio frequency radiation can be electromagnetically separated from, e.g., sensitive digital control circuitry.

Figure 6:
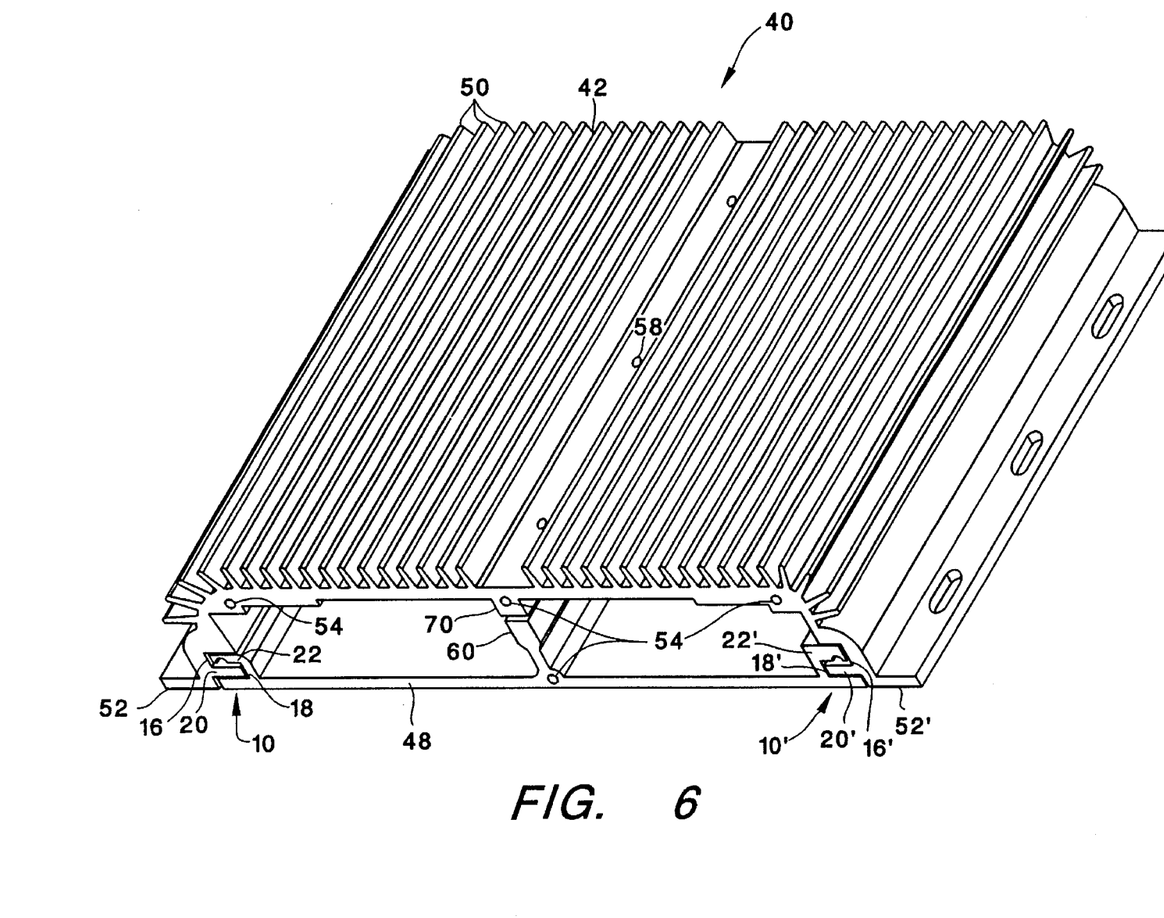
FIG. 6 is a perspective view of the housing assembly of FIG. 2A.

Referring next to FIG. 6, a perspective view is shown of the housing assembly 40 of FIG. 2A. The housing assembly includes the housing part 42 and the cover part 48. Thus, shown are the heat-sinking fins 50, the first and second mounting flanges 52 52', the end plate mounting holes 54, the compression screw holes 58, and the first flanges 20, 20' and the first channels 16, 16' of the first and second extrusion interlock assemblies 10, 10', the compression beam 60 that includes the compression screw mounting holes 62 (FIG. 2A), the second flanges 22, 22' of the first and second extrusion interlock assemblies. As can be seen, the compression beam 60 is aligned adjacent to the central mounting structure 70, which is slightly off-center between the extrusion interlock assemblies 10, 10'.

Figure 7:
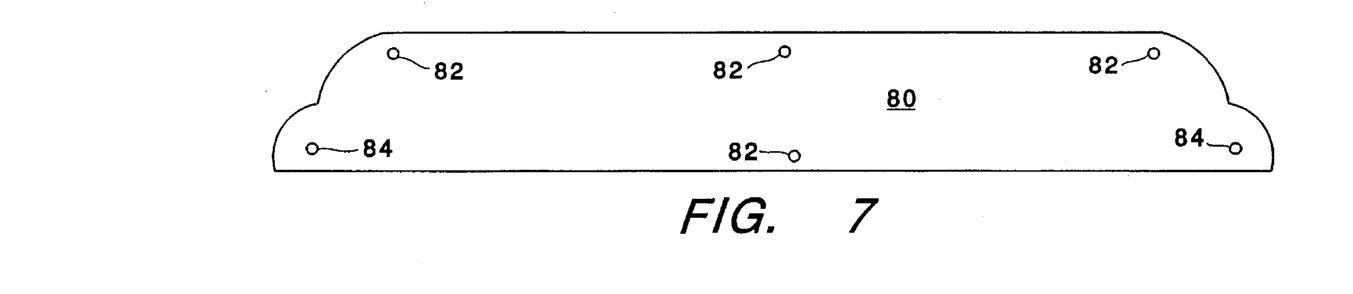
FIG. 7 is a front view of a proximal end plate that is used with the housing assembly of FIG. 6.

Referring next to FIG. 7, a front view of the proximal end plate 80 is shown. The end plate 80 includes the end plate holes 82 through which the end plate mounting screws are fastened into the end plate mounting holes 54 (FIG. 2A) in order to secure the end plate 80 to the housing assembly 40 (FIG. 5). In addition, the fastener holes 84 are shown. The fasteners 24 (FIG. 2A) pass through the end plate 80 via the fastener holes 84 and into the longitudinal grooves 38, 38' (FIG. 4). In this way, not only are the toungues 20, 20', 22, 22' (FIGS. 3 and 4) of the extrusion interlock assemblies 10, 10' (FIG. 5) displaced, as described above, but the end plate 80 is further secured to the housing assembly 40 (FIG. 5). Note that in practice, both the proximal and distal end plates 80 are used in the manner described above, and the distal end plate is a mirror image of the proximal end plate 80 as shown in FIG. 7.

Thus, as illustrated in FIGS. 3 through 7, the advantageous housing assembly, utilizing the extrusion interlock assembly of the present invention, provides for excellent electrical and mechanical connection between the housing piece and the cover piece at first and second edges of such pieces.

While the invention herein disclosed has been described by means of specific embodiments and applications thereof, numerous modifications and variations could be made thereto by those skilled in the art without departing from the scope of the invention set forth in the claims.

What is claimed is:

1. An interlocking joint for adjacent sides of an extrusion assembly enabling the adjacent sides to be slidably mated, comprising:

a first channel formed between a first interior engaging surface and a first fastening surface;

a first flange juxtaposed with the first channel wherein the first flange includes a first exterior engaging surface and the first fastening surface, wherein the first flange and the first channel comprise a first adjoining portion of a first of the adjacent sides;

a second channel formed between a second interior engaging surface and a second fastening surface, wherein the second channel slidably receives the first flange, such that the second interior engaging surface is adjacent to the first exterior engaging surface and the second fastening surface is adjacent to the first fastening surface;

a second flange juxtaposed with the second channel wherein the second flange includes a second exterior engaging surface and the second fastening surface, wherein the second flange and the second channel comprise a second adjoining portion of a second of the adjacent sides, wherein a groove projects into the second fastening surface, and wherein the second flange is slidably received by the first channel, such that the second exterior engaging surface is adjacent to the first interior engaging surface and the second fastening surface is adjacent to the first fastening surface; and a fastener interposed between the first fastening surface and the groove for mechanically engaging the first interior engaging surface against the second exterior engaging surface along a first plane of engagement, and for mechanically engaging the first exterior engaging surface against the second interior engaging surface along a second plane of engagement.

2. The interlocking joint of claim 1 wherein said first of said adjacent sides is a housing part, wherein the housing part is "U" shaped.

3. The interlocking joint of claim 2 wherein said second of said adjacent sides is a cover part, wherein the cover part is "T" shaped.

4. The interlocking joint of claim 3 wherein said housing part and said cover part are joined together at said interlocking joint so as to form a "B" shaped assembly.

5. The interlocking joint of claim 3, wherein:

said housing part includes:
a first longitudinal structure that electrically and mechanically contacts a first conductive portion of a first side of a circuit board; and said cover part includes:
a second longitudinal structure that electrically and mechanically contacts a second conductive portion of a second side of the circuit board, wherein the second conductive portion is opposite the first conductive portion.

6. The interlocking joint of claim 5 wherein said housing part includes exterior heat sinking fins.

7. A method for slidably mating interlocking adjacent sides of an extrusion assembly, including the steps of:

(a) sliding a first flange of a first of the adjacent sides, wherein the first flange includes a first exterior engaging surface, and a first fastening surface, into a second channel of a second of the adjacent sides, wherein the second channel includes a second interior engaging surface and a second fastening surface, such that the first exterior engaging surface is adjacent to the second interior engaging surface and the first fastening surface is adjacent to the second fastening surface;

(b) sliding, concomitantly with the sliding in step (a), a second flange of the second of the adjacent sides, wherein the second flange includes a second exterior engaging surface, and the second fastening surface into a first channel of the first of the adjacent sides, wherein the first channel that includes a first interior engaging surface and the first fastening surface, such that the second exterior engaging surface is adjacent to the first interior engaging surface and the second fastening surface is adjacent to the first fastening surface; and (c) interposing a fastener between the first fastening surface and a groove that projects into the second fastening surface so as to mechanically engage the first exterior engaging surface against the second interior engaging surface along a first plane of engagement, and so as to mechanically engage the first interior engaging surface against the second exterior engaging surface along a second plane of engagement.

8. An apparatus for slidably mating interlocking first and second adjacent parts of an extrusion assembly, including:

first flange means of the first part for sliding into second channel means of the second part, wherein the first flange means includes a first exterior engaging surface and a first fastening surface, wherein the second channel means includes a second interior engaging surface and a second fastening surface, and wherein the sliding includes positioning the first exterior engaging surface adjacent to the second interior engaging surface and the second fastening surface adjacent to the first fastening surface;

second flange means of the second part for sliding into first channel means of the first part, wherein the second flange means includes a second exterior engaging surface and the second fastening surface, wherein the first channel means includes a first interior engaging surface and the first fastening surface, and wherein the sliding includes positioning the second exterior engaging surface adjacent to the first interior engaging surface and the first fastening surface adjacent to the second fastening surface; and fastener means for mechanically engaging the first exterior engaging surface against the second interior engaging surface along a first plane of engagement, and for mechanically engaging the first interior engaging surface against the second exterior engaging surface along a second plane of engagement.

9. The apparatus of claim 8 including a groove that projects into said second fastening surface, wherein said fastener means is interposed between said first fastening surface and the groove.

10. An interlocking joint for adjacent first and second sides of an extrusion assembly enabling the adjacent sides to be slidably mated, including:

a first flange that is mechanically connected to the first side;

a second channel that is mechanically connected to the second side, wherein the second channel slidably receives the first flange; and a fastener that laterally displaces the first flange away from the second channel so as to cause the first flange to frictionally engage the second channel along a first plane of engagement.

11. The interlocking joint of claim 10 including:

a first channel that is mechanically connected to said first side, and that is adjacent to said first flange; and a second flange that is mechanically connected to said second side, and that is adjacent to said second channel, wherein the second flange is slidably received by the first channel; and wherein said fastener laterally displaces the second flange away from the first channel to as to cause the second flange to frictionally engage the second channel along a second plane of engagement.

12. The interlocking joint of claim 11 wherein said second flange includes a groove that is opposite said second plane of engagement, and wherein said fastener is interposed into said groove so as to realize said lateral displacement.

* * * * *